(12) United States Patent
Miyazaki et al.

(10) Patent No.: US 11,249,147 B2
(45) Date of Patent: Feb. 15, 2022

(54) MAGNETIC SENSOR

(71) Applicant: FUJIDENOLO CO., LTD., Komaki (JP)

(72) Inventors: Hideki Miyazaki, Komaki (JP); Shinsuke Kato, Komaki (JP); Kazunobu Maekawa, Komaki (JP)

(73) Assignee: FUJIDENOLO CO., LTD., Komaki (JP)

( * ) Notice: Subject to any disclaimer, the term of this patent is extended or adjusted under 35 U.S.C. 154(b) by 167 days.

(21) Appl. No.: 16/612,886

(22) PCT Filed: May 10, 2018

(86) PCT No.: PCT/JP2018/018228
§ 371 (c)(1),
(2) Date: Nov. 12, 2019

(87) PCT Pub. No.: WO2018/207898
PCT Pub. Date: Nov. 15, 2018

(65) Prior Publication Data
US 2020/0166585 A1 May 28, 2020

(30) Foreign Application Priority Data
May 10, 2017 (JP) .............................. JP2017-094313

(51) Int. Cl.
*G01R 33/028* (2006.01)
*G01R 33/09* (2006.01)

(52) U.S. Cl.
CPC ....... *G01R 33/0283* (2013.01); *G01R 33/093* (2013.01)

(58) Field of Classification Search
CPC . G01R 33/0283; G01R 33/063; G01R 33/093
See application file for complete search history.

(56) References Cited

U.S. PATENT DOCUMENTS 6,232,775 B1 * 5/2001 Naitoh .................... C22C 38/10
148/305
6,278,588 B1 8/2001 Ruigrok
(Continued)

FOREIGN PATENT DOCUMENTS

EP 1041391 A2 10/2000
JP 2001-185778 A 7/2001
(Continued)

OTHER PUBLICATIONS

Jul. 17, 2018 International Search Report issued in International Patent Application No. PCT/JP2018/018228.
(Continued)

*Primary Examiner* — Son T Le
*Assistant Examiner* — Adam S Clarke
(74) *Attorney, Agent, or Firm* — Oliff PLC

(57) ABSTRACT

A magnetic sensor comprises a magnetic material portion; an excitation portion; and a magnetic detection portion, the magnetic sensor detecting a magnetic field by the magnetic detection portion detecting a detection magnetic field generated due to magnetic moments of the magnetic material portion. The excitation portion is configured to include a conductive material formed into an elongated shape, the magnetic material portion is a soft magnetic film formed on a surface of the conductive material, and the magnetic moments of the magnetic material portion are oriented along circumferential directions of the conductive material orthogonal to a longitudinal direction of the conductive material such that the magnetic moments directed to one of the circumferential directions and the magnetic moments direction in another circumferential direction opposite to the one circumferential direction are distributed in substantially equal amounts.

7 Claims, 9 Drawing Sheets

(56) References Cited

U.S. PATENT DOCUMENTS

| | | | | |
|---|---|---|---|---|
| 6,466,012 B1* | 10/2002 | Mouri | ................... | G01R 33/02 |
| | | | | 324/249 |
| 2010/0148771 A1 | 6/2010 | Ueda | | |
| 2010/0188079 A1 | 7/2010 | Ueda et al. | | |
| 2010/0289490 A1* | 11/2010 | Fan | ..................... | G01R 33/098 |
| | | | | 324/260 |
| 2016/0041236 A1 | 2/2016 | Nakayama et al. | | |
| 2018/0045792 A1 | 2/2018 | Kawano et al. | | |

FOREIGN PATENT DOCUMENTS

| | | | |
|---|---|---|---|
| JP | 2002-529908 A | 9/2002 | |
| JP | 2003-004830 A | 1/2003 | |
| JP | 2004-103970 A | 4/2004 | |
| JP | 2009-002695 A | 1/2009 | |
| JP | 2014-173980 A | 9/2014 | |
| WO | 00/26683 A1 | 5/2000 | |
| WO | 2016/143504 A1 | 9/2016 | |

OTHER PUBLICATIONS

Jul. 17, 2018 Written Opinion issued in International Patent Application No. PCT/JP2018/018228.
Dec. 22, 2020 Search Report issued in European Patent Application No. 18797562.8.
Dec. 8, 2020 Office Action issued in Japanese Patent Application No. 2017-094313.
Apr. 20, 2021 Office Action issued in Japanese Patent Application No. 2017-094313.

* cited by examiner

| FREQUENCY [MHz] | IMPEDANCE CHANGE RATE [%] | |
|---|---|---|
| | PRESENT INVENTION (PLATING WIRE) | COMPARISON EXAMPLE (AMORPHOUS WIRE) |
| 1 | 0.63 | 38.37 |
| 10 | 0.20 | 31.41 |
| 20 | 0.19 | 19.45 |
| 30 | 0.14 | 16.46 |
| 40 | 0.04 | 12.36 |
| 50 | 0.10 | 9.18 |
| 60 | 0.03 | 7.83 |
| 70 | 0.31 | 11.01 |
| 80 | -0.17 | 12.21 |
| 90 | 0.08 | 5.82 |
| 100 | -0.08 | -2.06 |

| FREQUENCY [MHz] | IMPEDANCE CHANGE RATE [%] | |
|---|---|---|
| | PRESENT INVENTION (PLATING WIRE) | COMPARISON EXAMPLE (AMORPHOUS WIRE) |
| 1 | 0.40 | 12.23 |
| 10 | 0.10 | 10.76 |
| 20 | 0.12 | 6.51 |
| 30 | 0.09 | 5.67 |
| 40 | 0.05 | 4.91 |
| 50 | 0.10 | 3.55 |
| 60 | 0.39 | 3.29 |
| 70 | 0.14 | 3.37 |
| 80 | -0.17 | 4.01 |
| 90 | -0.21 | 0.07 |
| 100 | -0.05 | -3.73 |

MAGNETIC SENSOR

TECHNICAL FIELD

The present invention relates to a magnetic sensor and, more particularly, to a magnetic detection device detecting magnetism based on a change in magnetic moment of a magnetic material.

BACKGROUND ART

For example, studies on magnetic measuring devices are extensively conducted for highly sensitively measuring magnetism on the order of picoteslas and nanoteslas and, for example, a magnetic measuring device using a superconducting quantum interference device (SQUID) or a magnetic impedance sensor (MI sensor) has been proposed.

For example, as shown in Patent Document 1, for example, a magnetic sensor using an MI sensor is a sensor utilizing a phenomenon in which energization of an MI (magnetoimpedance) element with an alternating current causes a change in the impedance of the MI element due to the skin effect depending on the frequency of the AC current used for the energization and has an advantage that the sensor can be reduced in size or can perform measurement with accuracy.

The MI sensor requires an alternating current energizing the MI element for generating the skin effect. While a magnetic anisotropic amorphous wire etc. are preferably used as the MI element; however, the electric resistance of the amorphous wire may make it difficult to use a large current for the energization.

PRIOR ART DOCUMENTS

Patent Documents

Patent Document 1: Japanese aid-Open Patent Publication No. 2003-004830

SUMMARY OF THE INVENTION

Technical Problem

The present invention was conceived in view of the situations and it is therefore an object of the present invention to provide a magnetic sensor enabling a simpler configuration while enabling accurate measurement by using a magnetic material.

Solution to Problem

The inventors of the present application found that when a magnetic material is formed into a film shape, application of a current to an object to be provided with the film enables electrodeposition while controlling orientation of a magnetic moment, that an electrodeposition layer having a different magnetic moment orientation is disposed by switching the direction of the electrodeposition current while performing the electrodeposition, and that overlapped multiple electrodeposition layers with different magnetic moment orientations have magnetic anisotropy as a whole. The present invention was conceived based on this knowledge.

To achieve the above object, a first aspect of the present invention provides a magnetic sensor comprising: (a) a magnetic material portion; an excitation portion applying an applied magnetic field changing on the basis of time to the magnetic material portion; and a magnetic detection portion detecting a magnetic field generated by the magnetic material portion, the magnetic sensor detecting a magnetic field by the magnetic detection portion detecting a detection magnetic field generated due to magnetic moments of the magnetic material portion changing between a state without application of the applied magnetic field and a state of being magnetized by the applied magnetic field, wherein (b) the excitation portion is configured to include a conductive material formed into an elongated shape, (c) the magnetic material portion is a soft magnetic film formed on a surface of the conductive material, and (d) the magnetic moments of the magnetic material portion are oriented along circumferential directions of the conductive material orthogonal to a longitudinal direction of the conductive material such that the magnetic moments directed to one of the circumferential directions and the magnetic moments direction in another circumferential direction opposite to the one circumferential direction are distributed in substantially equal amounts.

Advantageous Effects of Invention

The magnetic sensor according to the first aspect of the invention detects a magnetic field by the magnetic detection portion detecting a detection magnetic field generated due to magnetic moments of the magnetic material portion changing between a state without application of the applied magnetic field and a state of being magnetized by the applied magnetic field, and since the magnetic material portion is a soft magnetic film formed on the surface of the conductive material, the magnetic field can be applied to the soft magnetic film by causing a current to flow through the conductive material. Since the magnetic moment of the magnetic material portion is oriented in the circumferential direction of the conductive material orthogonal to the longitudinal direction of the conductive material, and the magnetic moments directed oppositely to each other are distributed in substantially equal amounts, the linearity of the sensor output with respect to an external magnetic field to be measured by the magnetic sensor can be made favorable.

Preferably, (a) the magnetic material portion is made up of a plurality of layers (b) such that the magnetic moment in each of the layers is oriented in one direction orthogonal to the longitudinal direction of the conductive material or in a direction opposite to the one direction, and (c) includes at least one each of a first layer having the magnetic moment oriented in the one direction and a second layer having the magnetic moment oriented in the direction opposite to the one direction. As a result, by sequentially disposing the first and second layers having the directions of the magnetic moments oriented in certain respective directions, the magnetic anisotropy can be induced in the entire layers made up of these first and second layers.

Preferably, (a) the magnetic detection portion is a solenoid coil, wherein (b) the solenoid coil is arranged such that the conductive material provided with the magnetic material portion is housed in a cylindrical space of the solenoid coil with a longitudinal direction of the solenoid coil made identical to the longitudinal direction of the conductive material, and wherein (c) the magnetic detection portion performs magnetic detection based on an electromotive force generated at both ends of the solenoid coil. As a result, a change in the state of the magnetic moment in the magnetic material portion can accurately be detected by the solenoid coil.

Preferably, the magnetic material portion has composition containing iron (Fe) and nickel (Ni). As a result, a material with magnetism can favorably be electrodeposited on the surface of the conductive material.

Preferably, the magnetic material portion contains iron (Fe) in a proportion of 15 to 25%. As a result, the magnetic material portion can have a favorable magnetic permeability.

Preferably, an amount of change in impedance of the conductive material is 5% or less when an excitation current has a frequency of 100 [MHz] or less within a range of magnitude of the external magnetic field of −50 [μT] or more to 50 [μT] or less. As a result, the amount of change in impedance of the conductive material is extremely small in the range of the external magnetic field to be measured, so that stable magnetic measurement can be performed.

Preferably, the magnetic material portion for the magnetic sensor is obtained by (a) forming a magnetic material on a surface of an elongated conductive material, includes (b) a first formation process of causing a formation current to flow in one longitudinal direction of the conductive material to form the magnetic material and (c) a second formation process of causing the formation current to flow in a direction opposite to the one longitudinal direction of the conductive material to form the magnetic material, and is characterized in that (d) a total amount of the formation current flowing in the first formation process is substantially equal to a total amount of the formation current flowing in the second formation process. As a result, the magnetic material layers having the magnetic moments oriented oppositely to each other can be formed respectively in the first formation process and the second formation process while the total amount of the formation current flowing in the first formation process is substantially equal to the total amount of the formation current flowing in the second formation process, so that the magnetic anisotropy can be induced in the entire magnetic material portion.

Preferably, the formation current includes the plating current for generating a potential difference between the conductive material serving as the plating cathode and the plating anode and the bias current for aligning the magnetic moment in the magnetic material. As a result, while the magnetic moment is oriented by both the plating current and the bias current, the magnetic material portion can be formed by plating.

MODES FOR CARRYING OUT THE INVENTION

An embodiment of the present invention will now be described in detail with reference to the drawings.

First Embodiment

Figure 1:
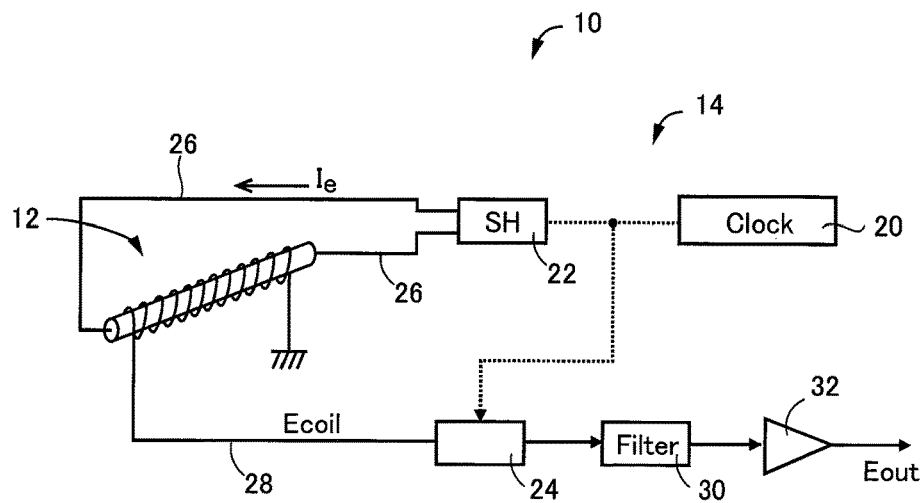
FIG. 1 is a diagram for explaining a configuration in an embodiment of a magnetic sensor of the present invention.

FIG. 1 is a diagram for explaining an overview of a magnetic sensor 10 of the present invention. The magnetic sensor device 10 is configured to include a probe portion 12 for detecting magnetism and a circuit portion 14 for driving the probe portion 12. The magnetic sensor device 10 corresponds to a magnetic sensor of the present invention. The configuration of the probe portion 12 will be described later.

The circuit portion 14 is configured to include a clock portion 20 and a current supply portion 22 disposed for supplying a current to a conductor portion 42 of the probe portion 12 described later. The clock portion 20 is a CMOS IC, for example, and outputs pulse signals at predetermined intervals. The current supply portion 22 supplies a periodically changing current Ie to the conductor portion 42 of the probe portion 12 based on a power source voltage supplied from a power source not shown in synchronization with the clock signal output from the clock portion 20. The periodically changing current Ie is a sine wave or a square wave changing in a pulse shape, for example. This current Ie corresponds to an excitation current inverted on the basis of time in the present invention and is a current changing in a predetermined period. The predetermined period may be a fixed value or may be variable.

The circuit portion 14 includes a sample-and-hold circuit 24, a filter 30, and an amplifier 32 disposed for detecting an induced electromotive force Bout of a coil 50 of the probe portion 12 described later. The sample-and-hold circuit 24 detects a peak (peak value) of amplitude of an electromotive force Ecoil of the coil 50. A trigger signal is supplied from the clock portion 20 to the sample-and-hold circuit 24, and the sample-and-hold circuit 24 detects a peak value for each predetermined phase in synchronization with this trigger signal. The filter 30 removes a high frequency component and a low frequency component (cuts high and low frequencies) from the output Ecoil of the coil 50 and extracts only a desired frequency component. The amplifier 32 amplifies the output signal of the filter 30 with a predetermined offset voltage Offset by a factor of about 1000, for example. The signal Eout output in this way is displayed on a display device such as a monitor not shown, recorded in a recording device, or transmitted to another device. Although not shown, a filter extracting only a desired frequency component from the output signal of the amplifier 32 may be disposed in addition to the filter 30 or instead of the filter 30.

The sample-and-hold circuit 24, the filter 30, and the amplifier 32 of the circuit portion 14 in this embodiment constitute a magnetic detection portion together with the coil 50 described later.

Figure 2:
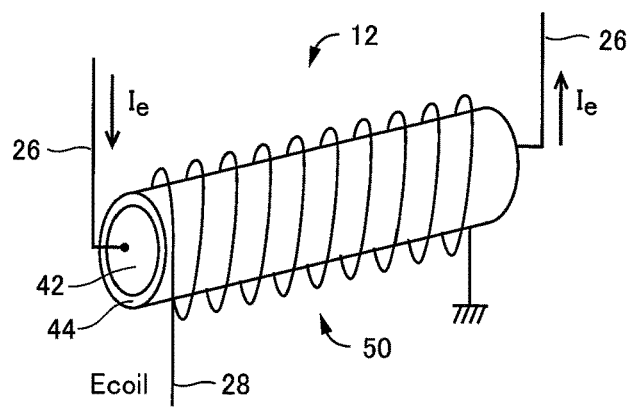
FIG. 2 is a diagram for explaining a basic configuration of a probe portion of the magnetic sensor in FIG. 1.

FIG. 2 is a diagram for conceptually explaining a basic configuration of the probe portion 12. The probe portion 12 is configured to include the conductor portion 42 that is an elongated conductor and the coil 50. The conductor portion 42 corresponds to a conductive material of the present invention and has an elongated shape such as a substantially circular columnar shape or a rectangular columnar shape (in the example of FIG. 2, the conductor portion 42 has a circular columnar shape) with both end surfaces connected to conducting wires 26. Due to electric connection to the current supply portion 22 through the conductive wires 26, the current Ie can flow between both ends of the conductor portion 42. The conductor portion 42 can be made of a material selected from those having good electrical conductivity such as copper and nickel, for example; However, since a soft magnetic film 44 is electrodeposited on the conductor portion 42 by plating as described later, the material is preferably easily plated. Preferably, the conductor portion 42 is made of a conductive material having a lower electrical resistivity than the soft magnetic film 44. This makes a change in impedance due to an external magnetic field smaller, and therefore, an excitation current can stably be applied regardless of the external magnetic field. For example, the conductor portion 42 is a circular columnar wire having a diameter of 10 to 500 [μm], preferably 30 to 100 [μm]. This is because an excessively small diameter reduces strength and makes handling difficult, while an excessively large diameter requires a large current as the current Ie for generating an applied magnetic field Be described later.

The coil 50 is a so-called solenoid coil having an elongated cylindrical shape. The conductor portion 42 is substantially concentrically disposed inside a cylindrical inner portion of the coil 50. In the example of FIG. 2, the length of the coil 50 in the longitudinal direction and the length of the conductor portion 42 in the longitudinal direction are substantially the same; however, the present invention is not limited thereto, and the length of the coil 50 in the longitudinal direction may be longer or shorter than the length of the conductor portion 42 in the longitudinal direction as long as a change in a magnetic field generated by the soft magnetic film 44 disposed in the conductor portion 42 described later can sufficiently be detected. One end of the coil 50 is grounded, and the other end is connected to the circuit portion 14 described above, or specifically, the sample-and-hold circuit 24 thereof, by a conducting wire 28, so that the value of the electromotive force Ecoil of the coil 50 is detectable.

Figure 3:
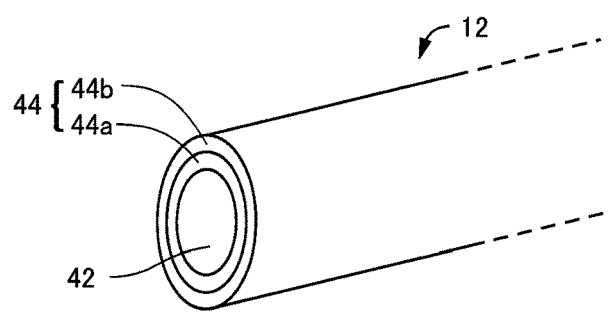
FIG. 3 is a view for explaining an example of a conductor portion in which a soft magnetic film is formed, in the probe portion of FIG. 2.

The soft magnetic film 44 made up of multiple layers is disposed on a side surface having a cylindrical shape included in the surface of the conductor portion 42. FIG. 3 is a view for explaining an example of the conductor portion 42 in which the soft magnetic film 44 is formed. In FIG. 3, the coil 50 is not shown. In the example of FIG. 3, two layers, i.e., a first layer 44a and a second layer 44b, are disposed as the soft magnetic film 44. This soft magnetic film 44 corresponds to a soft magnetic film and a magnetic material portion of the present invention. In this embodiment, each of the first layer 44a and the second layer 44b is a magnetic material formed, i.e., electrodeposited, by plating. The soft magnetic film 44 is a magnetic body and, specifically, is configured to include iron (Fe) and nickel (Ni), for example. Specifically, the iron content is 15 to 25 (wt %), more preferably 18 to 22 (wt %). As a result, the magnetic permeability of the magnetic film 44 can be increased, and the sensitivity of the magnetic sensor 10 can be enhanced. The thickness of the magnetic film 44 is, for example, 1 to 50 [μm], preferably 1 to 15 [μm]. An improved sensitivity of the magnetic sensor 10 is experimentally obtained in this way. Both the first layer 44a and the second layer 44b have the same composition.

Figure 4:
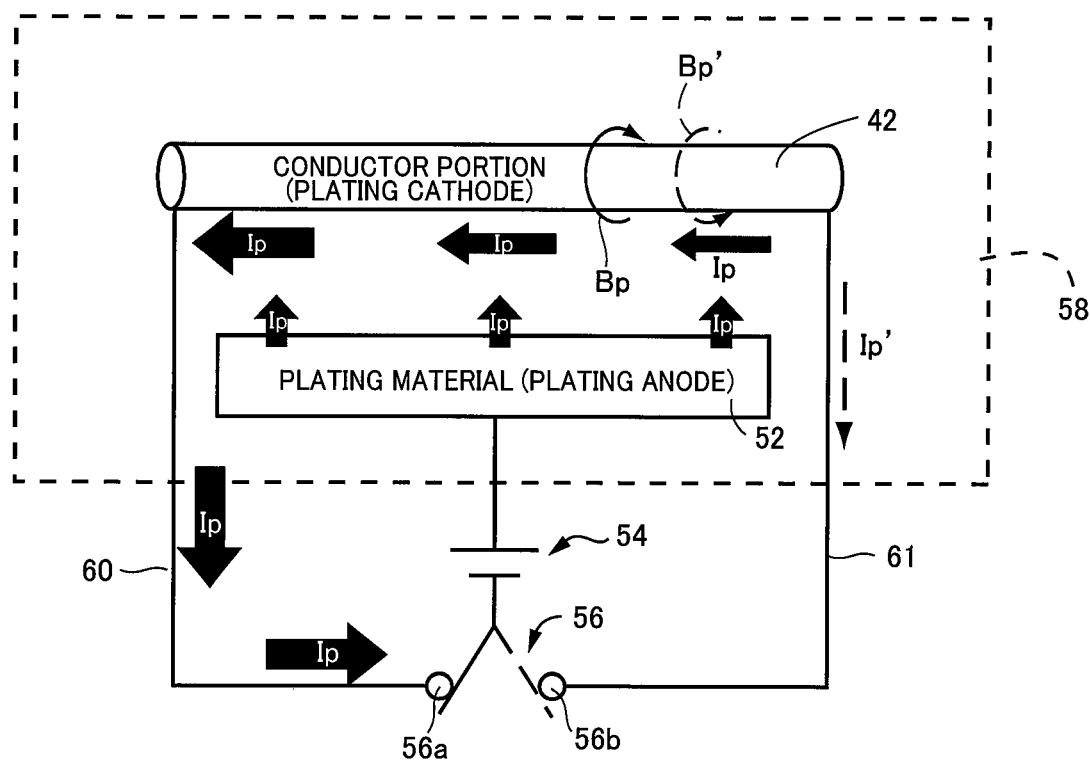
FIG. 4 is a diagram for explaining an overview of plating for forming the soft magnetic film of FIG. 3.

FIG. 4 is a diagram for explaining an overview of so-called plating for forming the first layer 44a and the second layer 44b as the soft magnetic film 44. In a plating tank 58, the conductor portion 42 and a plating material 52 are immersed in a plating solution. The plating material 52 is a metal containing iron and nickel as described above and acts as a plating anode in a plating process. For the plating material 52, metals are used in a combined manner so that a desired composition is achieved in the soft magnetic film 44 as described above, for example, at the same ratio as the composition in the soft magnetic film.

Both ends of the conductor portion 42 are electrically connected to terminals 56a and 56b of a switch 56 by conducting wires 60 and 61, respectively. As shown in the example of FIG. 4, when the switch 56 connects a plating power source 54 and the terminal 56a, a plating current flows as indicated by Ip in FIG. 4. As a result, the metal forming the plating anode 52 is oxidized and ionized and is eluted into the plating solution. The eluted metal ions are reduced on the surface of the conductor portion 42 to form a thin film-shaped metal, so that the conductor portion 42 is plated with the metal constituting the plating anode 52, i.e., the metal containing iron and nickel.

In this case, since the plating current Ip flows through the conductor portion 42 in the longitudinal direction thereof as shown in FIG. 4, a magnetic field Bp is generated in a direction of wrapping around the conductor portion 42 having an elongated shape. Therefore, when the metal ions in the plating solution are reduced and fixed onto the surface of the conductor portion 42, the magnetization direction thereof is affected by the magnetic field. Bp. Specifically, the plating is configured such that the magnetization direction of the metal ions (magnetic moment direction) is aligned with (oriented in) the direction of the magnetic field Bp. This is a first plating process and corresponds to a first formation process of the present invention, and the plating current $1p$ corresponds to a formation current.

On the other hand, when the switch 56 is switched such that the plating power source 54 and the terminal 56b are connected, a plating current Ip' in this case flows from the plating power source 54 through the plating anode 52, the conductor portion 42, the conducting wire 61, and the switch 56 in this order. In this case, regarding the conductor portion 42, the direction of flow of the plating current Ip' is opposite to the direction of the plating current Ip described above in the state of the switch 56 connecting the plating power source 54 and the terminal 56a. Therefore, a direction of a magnetic field Bp' caused by the plating current Ip' is as indicated by a dashed arrow of FIG. 4 and is opposite to the direction of the magnetic field Bp described above in terms of the circumferential direction of the circular columnar conductor portion 42. Assuming that the plating process executed in this way is a second plating process, a magnetization direction of a plating layer obtained by the second plating process is a direction opposite to, i.e., having a difference of 180 degrees from, the first plating process in terms of the circumferential direction of the conductor portion 42. This second plating process corresponds to a second formation process of the present invention.

The magnitude of the plating current Ip in the first plating process and the second plating process is determined such that the magnitude becomes sufficient for the plating and sufficient for generating the magnetic field Bp sufficiently orienting the magnetization of the metal ions in a desired direction.

As described above, each of the magnetizations contained in the first layer 44a and each of the magnetizations contained in the second layer 44b are opposite to each other in terms of the circumferential direction of the conductor portion 42 and, preferably, an amount of magnetization contained in the first layer 44a is made substantially equal to an amount of magnetization contained in the second layer 44b. Specifically, an integrated amount (in coulomb (=ampere second)) of the plating current Ip during execution of the first plating process is made equal to an integrated amount of the plating current Ip' during execution of the second plating process. As a result, the soft magnetic film 44 has magnetic anisotropy.

Figure 5:
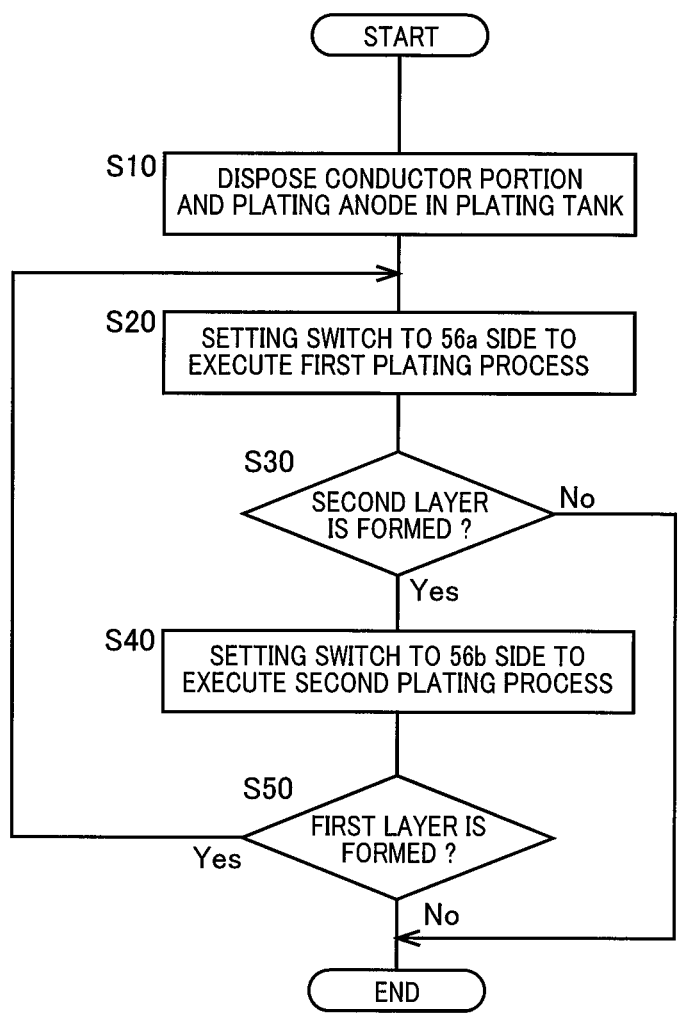
FIG. 5 is a flowchart for explaining a process for forming the soft magnetic film.

FIG. 5 is a flowchart for explaining a process for generating a process of forming the soft magnetic film 44. At step S10 (hereinafter, "step" will be omitted), the conductor portion 42 serving as a plating cathode and the plating material 52 serving as a plating anode are arranged in the plating tank 58 and are electrically wired as shown in FIG. 4.

At S20, the first plating process is executed. For example, as shown in FIG. 4, the first plating process is executed by setting the switch 56 to the terminal 56a side and thereby causing the plating current Ip to flow through the conductor portion 42, and the first layer 44a is formed. The execution time of the first plating process is determined in consideration of the integrated amount of the plating current Ip during execution of the first plating process as described above. When the predetermined execution time has elapsed, the first plating process is terminated.

At S30, it is determined whether the second plating process is subsequently executed. If the second plating process is executed, S40 is subsequently executed, and if not executed, this flowchart is terminated.

At S40, the second plating process is executed. For example, as indicated by a broken line in FIG. 4, the second plating process is executed by setting the switch 56 to the terminal 56b side and thereby causing the plating current Ip' to flow through the conductor portion 42, and the second layer 44b is formed. The execution time of the second plating process is determined in consideration of the integrated amount of the plating current Ip' during execution of the second plating process. When the predetermined execution time has elapsed, the second plating process is terminated.

At S50, it is determined whether the first plating process is executed again. If the first plating process is executed, S20 is executed again, and if not executed, this flowchart is terminated.

In this way, the first layer 44a and the second layer 44b in the soft magnetic film 44 can be disposed with a desired thickness and can repeatedly be disposed as many times as desired, and therefore, the respective amounts of magnetization contained in the first layer 44a and the second layer 44b can appropriately be adjusted.

FIG. 6A to 6D are diagrams for explaining an operating principle of the magnetic sensor 10 using the probe portion 12 configured as described above and for explaining how the magnetization (magnetic moment) changes in the soft magnetic film 44 of the probe portion 12. In FIG. 6, for explaining a state of respective magnetizations of the first layer 44a and the second layer 44b constituting the soft magnetic film 44, the probe portion 12 is shown in a cutaway view.

Figure 6A:
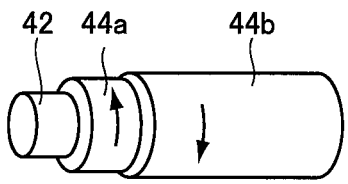
FIG. 6A to 6D are diagrams for explaining an operating principle of the magnetic sensor of this embodiment and for explaining how magnetization changes in the soft magnetic film.

FIG. 6A is a diagram for explaining the state of respective magnetizations of the first layer 44a and the second layer 44b while no magnetic field is applied to the probe portion 12. The magnetizations of the first layer 44a and the second layer 44b formed by the first plating process and the second plating process, respectively, are in circumferential directions of the cylindrical surface of the conductor portion 42, i.e., directions orthogonal to the longitudinal direction of the conductor portion 42, and are in directions made opposite to each other.

Figure 6B:
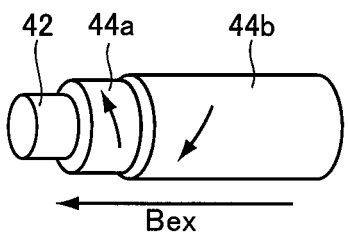

FIG. 6B is a diagram for explaining the case that an external magnetic field Bex is applied to the probe portion 12. Applying the external magnetic field Bex as shown in FIG. 6B results in a state of being affected by the external magnetic field Bex. Specifically, as shown in FIG. 6B when the external magnetic field Bex is applied leftward in the figure, the respective magnetizations of the first layer 44a and the second layer 44b are respectively inclined leftward in the figure as compared to the state without application of the magnetic field shown in FIG. 6A. A degree of this inclination depends on the magnitude of the external magnetic field Bex. The external magnetic field Bex corresponds to, for example, a magnetic field generated by a measurement object to be measured by the magnetic sensor 10.

Figure 6C:
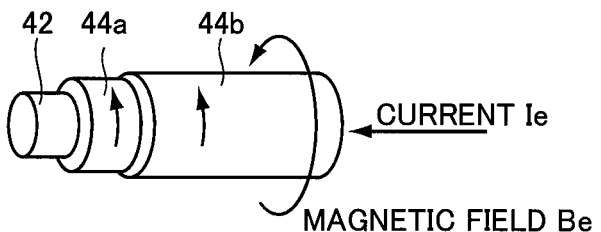
Figure 6D:
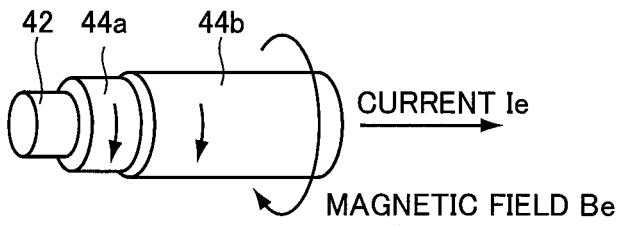

Each of FIGS. 6C and 6D is a diagram for explaining the case that an applied magnetic field is applied to the probe portion 12, or particularly, the soft magnetic film 44. In this embodiment, the applied magnetic field Be can be applied to the soft magnetic film 44 by causing the current Ie to flow through the conductor portion 42 of the probe portion 12. Specifically, FIG. 6C shows an example when the current Ie flows from the right to the left in the figure. The applied magnetic field Be is applied due to the current Ie as shown in FIG. 6C. Since the applied magnetic field Be has an influence on the probe portion 12 made greater than the external magnetic field Bex described above, the respective magnetizations of the first layer 44a and the second layer 44b have directions aligned with the applied magnetic field Be as shown in FIG. 6C when the applied magnetic field Be is applied, regardless of the presence/absence of the external magnetic field Bex.

FIG. 6D is a diagram for explaining an example when the current Ie flows in the direction opposite to FIG. 6D. Since the current Ie has the direction opposite to the case of FIG. 6C, the applied magnetic field Be is generated oppositely with respect to the circumferential direction of the conductor portion 42 (direction around an axis when the longitudinal direction is regarded as the axis), and the respective magnetizations of the first layer 44a and the second layer 44b have directions aligned with the applied magnetic field Be and made opposite to the case of FIG. 6C in terms of the circumferential direction of the conductor portion 42.

As described above, the current Ie is generated by the current supply portion 22 and is periodically changed. For example, when the current Ie is a sine wave inverted on the basis of time, the magnetization in the soft magnetic film 44 repeatedly changes as shown in FIG. 6A→FIG. 6C→FIG. 6A→FIG. 6D→FIG. 6A in the absence of the external magnetic field Bex or as shown in FIG. 6B→FIG. 6C→FIG. 6B→FIG. 6D→FIG. 6B in the presence of the external magnetic field Bex.

When the magnetization in the soft magnetic film 44 is repeatedly aligned (FIGS. 6C and 6D) and released (FIGS. 6A and 6B) due to the applied magnetic field Be, a minute magnetic field changing on the basis of time is generated. A magnitude of the minute magnetic field differs depending on the state of magnetization in the case of being released, for example, whether the released state is FIG. 6A or FIG. 6B, or a degree of the inclination even if the magnetization is inclined as shown in FIG. 6B. Therefore, by detecting the minute magnetic field changing on the basis of time as the electromotive force Ecoil with the coil 50 and evaluating the magnitude of the electromotive force Ecoil, the magnitude of the external magnetic field Bex in the probe portion 12 can be measured.

When a non-magnetic substance such as copper is used as the conductor portion 42, no residual magnetic field remains in the conductor portion 42, and therefore, hysteresis is advantageously less likely to occur in the relationship of the output Ecoil of the coil 50 relative to the external magnetic field Bex applied to the probe portion 12.

Additionally, the amount of magnetization contained in the first layer 44a is made substantially equal to the amount of magnetization contained in the second layer 44b as described above, so that the relationship of the output Ecoil of the coil 50 relative to the external magnetic field Bex applied to the probe portion 12 has a preferable characteristic in terms of linearity, particularly even when the magnetic field corresponds to a different direction of the external magnetic field Bex.

Figure 7:
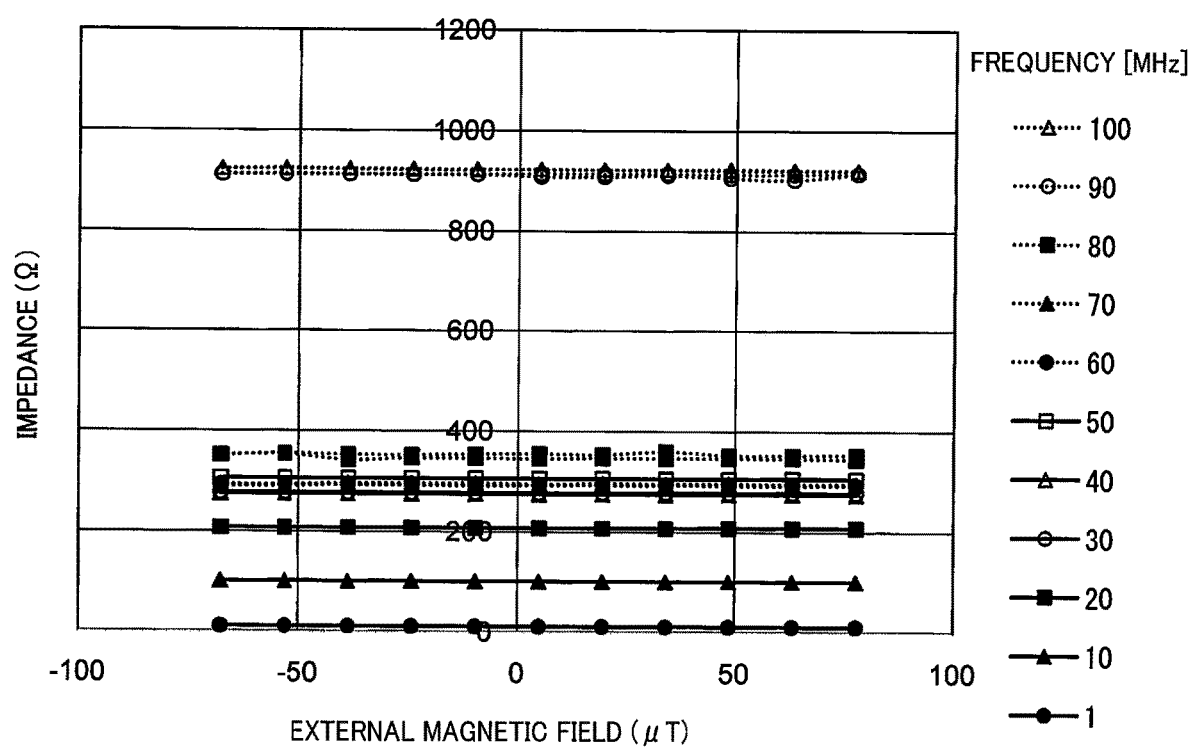
FIG. 7 is a diagram showing impedance characteristics of the conductor portion provided with the soft magnetic film of this embodiment.

FIG. 7 is a diagram showing impedance characteristics of the conductor portion 42 provided with the soft magnetic film 44 in the probe portion 12 of this embodiment. FIG. 7 shows a relationship of the magnitude of the impedance of the conductor portion 42 relative to the magnitude of the external magnetic field Bex applied to the probe portion 12 for each frequency when the relationship is obtained by varying the frequency of the current Ie applied to both ends of the conductor portion 42 within a range of 1 to 100 [MHz].

As shown in FIG. 7, according to the conductor portion 42 of this embodiment, when the frequency of the current Ie is within the range of 1 to 100 [MHz], an amount of change in the impedance of the conductor portion 42 is 5% or less even though the magnitude of the external magnetic field Bex applied to the conductor portion 42 is changed at least within the range of −50 to 50 [μT], and it can be seen that the impedance is hardly affected by the external magnetic field Bex.

Figure 8:
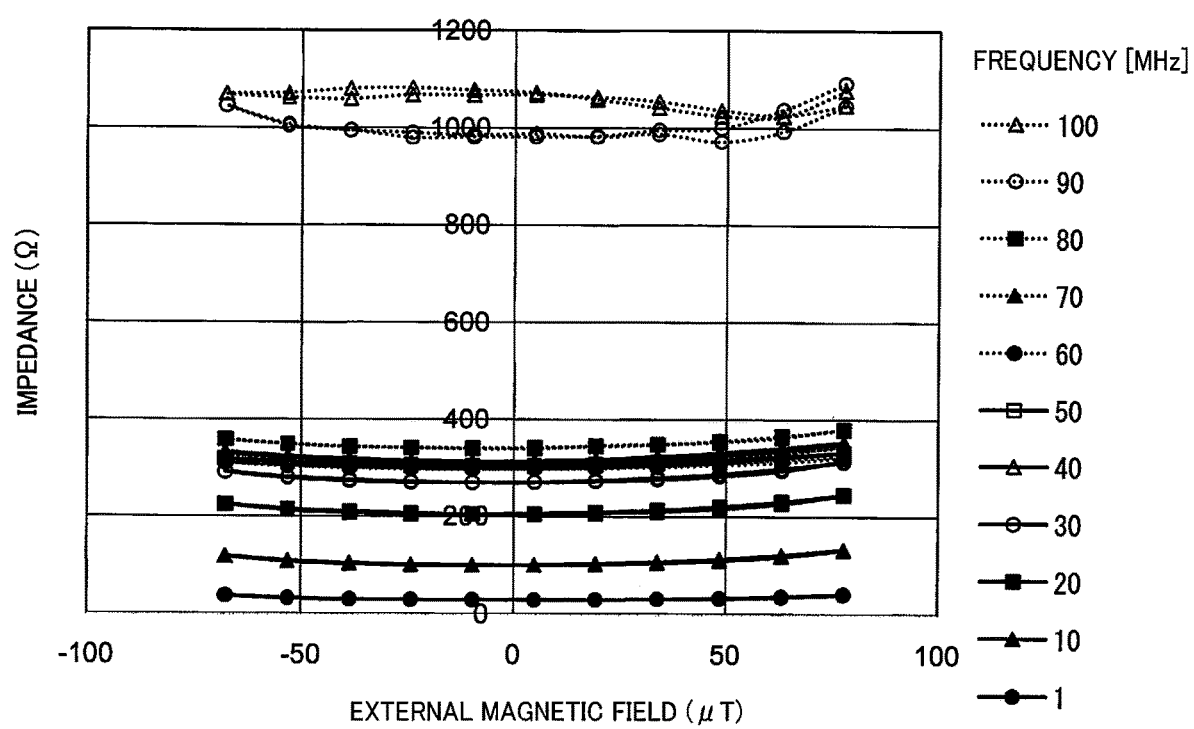
FIG. 8 shows results of measurement of impedance characteristics of an amorphous wire to be compared with the conductor portion of this embodiment under the same conditions as the experimental example of FIG. 7.

FIG. 8 is an experimental example for comparison with FIG. 7 and shows results of measurement of impedance of a wire made of an amorphous material (hereinafter referred to as an amorphous wire) to be compared with the conductor portion 42 of this embodiment under the same conditions as the experimental example of FIG. 7. Therefore, FIG. 8 shows a relationship of the magnitude of the impedance of the amorphous wire relative to the magnitude of the external magnetic field Bex applied to the amorphous wire for each frequency when the relationship is obtained by varying the frequency of the current Ie applied to both ends of the amorphous wire within the range of 1 to 100 [MHz].

As shown in FIG. 8, it can be seen that in the case of using the amorphous wire, the impedance of the amorphous wire changes when the magnitude of the external magnetic field Bex applied to the amorphous wire is changed within the range of −50 to 50 [μT] at any frequency of the current Ie from 1 to 100 [MHz].

Figures 9A, 9B:
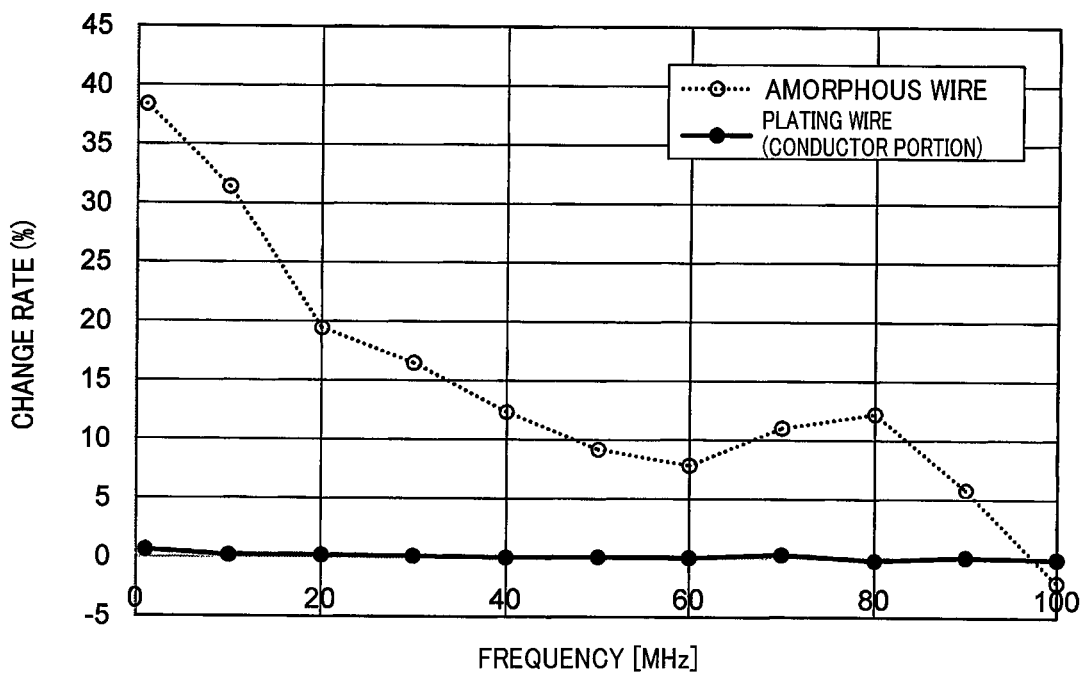
FIGS. 9A and 9B are diagrams showing an amount of change in impedance in the case of changing an external magnetic field for a conductor portion of this embodiment and the amorphous wire that is a comparative example for each frequency of an applied current.

FIGS. 9A and 9B are diagrams showing a change rate of the amount of change in impedance when the external magnetic field Bex is changed from −78 [μT] to +78 [μT], i.e., a rate (%) of the maximum value of the amount of change to the magnitude of the impedance when the external magnetic field Bex is 0 [μT], for each of the example of FIG. 7, i.e., the conductor portion 42 of this embodiment, and the example of FIG. 8, i.e., the amorphous wire that is a comparison example. FIG. 9A is a diagram showing the change rate for each frequency of the applied current Ie in a line graph, and FIG. 9B is a table showing specific numerical values. A negative value of the external magnetic field Bex indicates that the direction of the external magnetic field is the opposite direction.

Figures 10A, 10B:
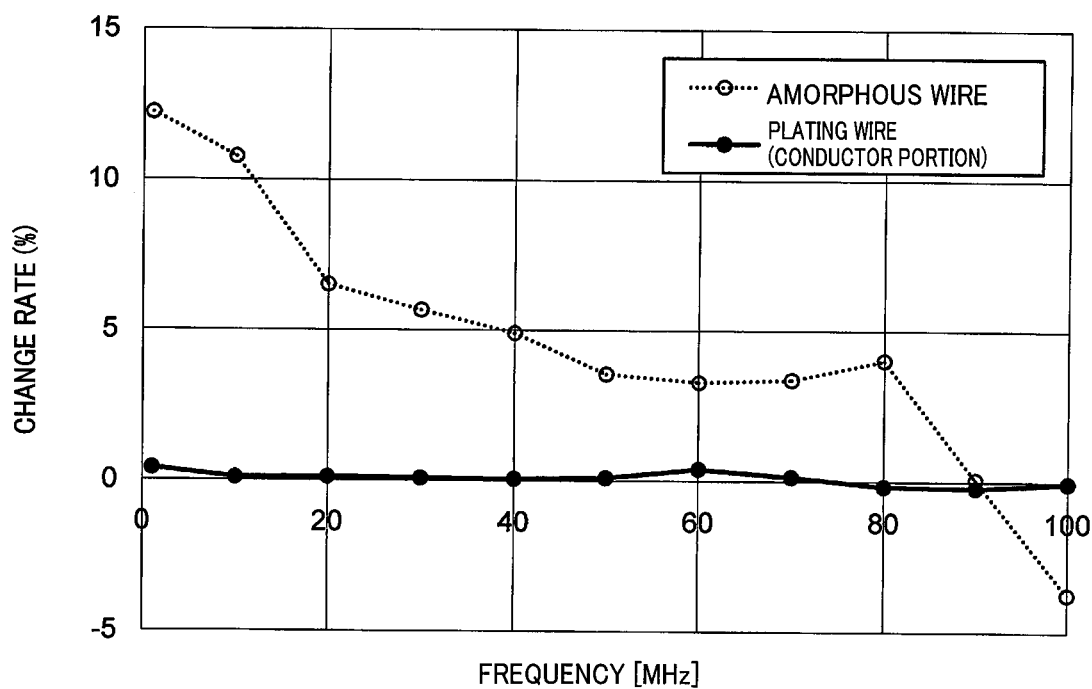
FIGS. 10A and 10B are diagrams showing an amount of change in impedance in the case of changing an external magnetic field in a range different from FIGS. 9A and 9B for the conductor portion of this embodiment and the amorphous wire that is a comparative example for each frequency of an applied current.

As with FIGS. 9A and 9B, FIGS. 10A and 10B are diagrams showing a change rate (%) of the amount of change in impedance when the external magnetic field Bex is changed from −50 [μT] to +50 [μT] for each of the example of FIG. 7, i.e., the conductor portion 42 of this embodiment, and the example of FIG. 8, i.e., the amorphous wire that is the comparison example. FIG. 10A is a diagram showing the change rate for each frequency of the applied current Ie in a line graph, and FIG. 10B is a table showing specific numerical values.

As shown in FIGS. 9A and 9B and 10A and 10B, the conductor portion 42 of this embodiment has substantially no change in impedance, i.e., tends to maintain substantially constant impedance, in the range of the external magnetic field Bex of −78 to 78 [μT] or −50 to 50 [μT] regardless of the frequency of the applied current Ie. On the other hand, it can be seen that the amorphous wire used for comparison has the impedance varying significantly due to the magnitude of the external magnetic field Bex depending on the frequency of the applied current Ie and that the variation is notable particularly at lower frequency.

As described above, it can be confirmed that the conductor portion 42 of this embodiment has a tendency to maintain substantially constant impedance regardless of the frequency of the applied current Ie. More specifically, it can be seen that the rate of the amount of change in impedance does not exceed 5% when the external magnetic field Rex is changed in the range of −78 to 78 [μT] or in the range of −50 to 50 [μT].

The amorphous wire used for comparison in FIG. 8 is suitably used as an MI element in an MI sensor (magnetic impedance sensor). Specifically, a high-frequency current is applied to both ends of the amorphous wire serving as the MI element to perform magnetic detection by utilizing a phenomenon in which the impedance of the amorphous wire changes depending on the frequency of the high-frequency current due to the skin effect.

On the other hand, regarding the conductor portion 42 of this embodiment, as shown in FIGS. 7 to 9A and 9B, the impedance value of the conductor portion 42 does not vary regardless of the magnitude of the external magnetic field Bex affecting the conductor portion 42 at each of the frequencies of the applied current Ie, and therefore, it can be seen that the magnetic sensor 10 using the conductor portion 42 of this embodiment enables the magnetic detection based on an operating principle completely different from the MI sensor described above.

The magnetic sensor 10 of the embodiment described above includes the soft magnetic film 44 having magnetic anisotropy, the conductor portion 42 applying the applied magnetic field Be inverted on the basis of time to the soft magnetic film 44, and the coil 50 detecting the magnetic field generated by the soft magnetic film 44, such that the coil 50 detects a detection magnetic field generated due to magnetic moments of the soft magnetic film 44 changing between a state without application of the applied magnetic field Be and a state of being magnetized by the applied magnetic field Be, and is configured to include the conductor portion 42 formed into an elongated shape and the current supply portion 22 applying the current Ie inverted on the basis of time to the conductor portion 42; the soft magnetic film 44 is electrodeposited on the surface of the conductor portion 42; the magnetic moments of the soft magnetic film 44 are oriented in the circumferential direction of the conductor portion 42 orthogonal to the longitudinal direction of the conductor portion 42 such that the magnetic moments directed oppositely to each other are distributed in substantially equal amounts; and the current supply portion 22 applies the applied magnetic field Be to the soft magnetic film 44 by applying the current Ie inverted on the basis of time to the conductor portion 42. As a result, since the soft magnetic film 44 is electrodeposited on the surface of the conductor portion 42, the magnetic field Be can be generated on the soft magnetic film 44 by the current supply portion 22 causing the current Ie to flow through the conductor portion 42. Since the magnetic moment of the soft magnetic film 44 is oriented in the circumferential direction of the conductor portion 42 orthogonal to the longitudinal direction of the conductor portion 42, and the magnetic moments directed oppositely to each other are distributed in substantially equal amounts, the linearity of the sensor output with respect to the external magnetic field Bex to be measured by the magnetic sensor 10 can be made favorable. Moreover, since the current supply portion 22 applies the current Ie to the conductor portion 42 having a small electric resistance, a large current can be applied to generate the applied magnetic field Be.

According to the magnetic sensor 10 of the embodiment described above, the soft magnetic film 44 is made up of multiple layers such that the magnetic moment in each of the layers is oriented in one direction perpendicular to the longitudinal direction of the conductive material or in a direction opposite to the one direction, and has at least one each of the first layer 44a having the magnetic moment oriented in the one direction and the second layer 44b having the magnetic moment oriented in the direction opposite to the one direction. As a result, by sequentially disposing the first and second layers 44a, 44b having the directions of the magnetic moments oriented in certain respective directions, the magnetic anisotropy can be induced in the entire soft magnetic film 44 made up of these first and second layers 44a, 44b.

According to the magnetic sensor 10 of the embodiment described above, since the coil 50 is the solenoid coil 50, and the solenoid coil 50 is arranged such that the conductor portion 42 provided with the soft magnetic film 44 is housed in the cylindrical space thereof with the longitudinal direction of the solenoid coil 50 made identical to the longitudinal direction of the conductor portion 42 so as to perform magnetic detection based on the electromotive force Ecoil generated at both ends of the solenoid coil 50, a change in the state of the magnetic moment in the soft magnetic film 44 can accurately be detected by the solenoid coil 50.

According to the magnetic sensor 10 of the embodiment described above, the soft magnetic film 44 has composition containing iron (Fe) and nickel (Ni), so that a material with magnetism can favorably be electrodeposited on the surface of the conductive material.

According to the magnetic sensor 10 of the embodiment described above, the soft magnetic film 44 contains iron (Fe) in a proportion of 15 to 25%, so that the soft magnetic film 44 can have a favorable magnetic permeability.

According to the magnetic sensor 10 of the embodiment described above, an amount of change in impedance of the conductor portion 42 provided with the soft magnetic film 44 is 5% or less when the frequency of the excitation current Ie applied from the current supply portion 22 to the conductor portion 42 is 100 [MHz] or less within a range of the magnitude of the external magnetic field Bex of −50 [μT] or more to 50 [μT] or less, and therefore, the amount of change in impedance of the conductor portion 42 provided with the soft magnetic film 44 is extremely small in the range of the external magnetic field to be measured, so that stable magnetic measurement can be performed.

In the embodiment described above, the soft magnetic film 44 for the magnetic sensor 10 is obtained by electrodepositing a magnetic material on the surface of the elongated conductor portion 42 and includes the first plating process (S20) of causing the plating current Ip to flow in one longitudinal direction of the conductor portion 42 for electrodeposition of the magnetic material and the second plating process (S40) of causing the plating current Ip' to flow in the direction opposite to the one longitudinal direction of the conductor portion 42 for electrodeposition of the magnetic material such that a temporal integrated value in the first plating process of the plating current Ip applied in the first plating process is substantially equal to a temporal integrated value in the second plating process of the plating current Ip' applied in the second plating process, and therefore, the magnetic material layers having the magnetic moments oriented oppositely to each other can be disposed by plating respectively in the first plating process and the second plating process while the temporal integrated value of the plating current applied in the first plating process is substantially equal to the temporal integrated value of the plating current applied in the second plating process, so that the magnetic anisotropy can be induced in the entire soft magnetic film 44 having these multiple magnetic material layers.

Another embodiment of the present invention will be described. In the following description, the portions common to the embodiments are denoted by the same reference numerals and will not be described.

Second Embodiment

Figure 11:
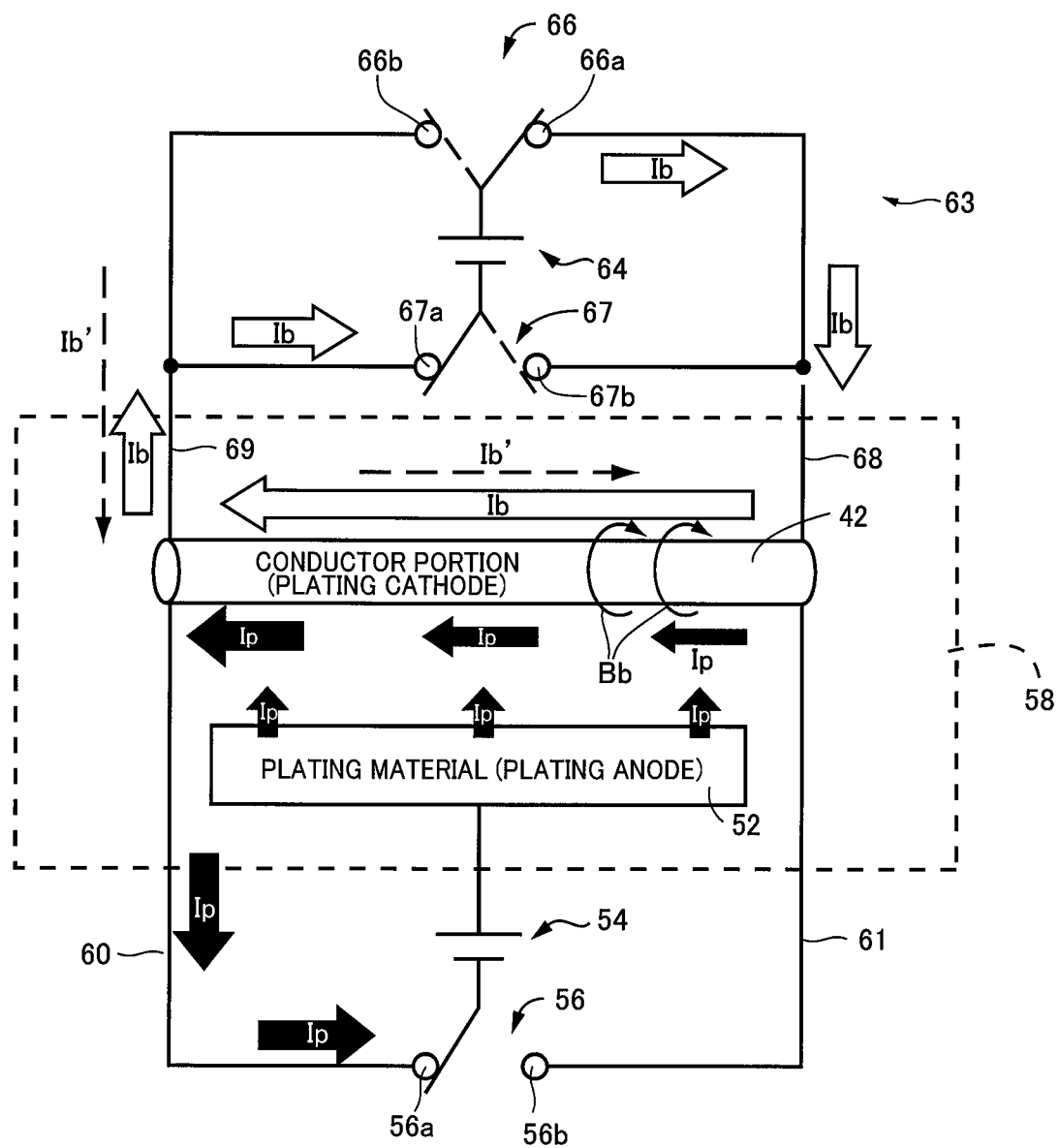
FIG. 11 is a diagram for explaining another form in which the conductor portion including a soft-magnetic film of this embodiment is manufactured, corresponding to FIG. 4.

FIG. 11 is a diagram for explaining another manufacturing device for the conductor portion 42 including the soft magnetic film 44 constituting the probe portion 12 in the magnetic sensor device 10 of this embodiment. FIG. 11 corresponds to FIG. 4 of the embodiment described above.

The device shown in FIG. 11 is provided with a bias circuit 63 in addition to the device shown in FIG. 4. The bias circuit 63 includes a bias power source 64 and switches 66 and 67, and the bias circuit 63 and the conductor portion 42 serving as the plating cathode are electrically connected by conducting wires 68 and 69, so that the bias power source 64 and the conductor portion 42 can be connected in series. Additionally, the switches 66 and 67 can be switched to select which of both ends of the conductor portion 42 is on the high potential side of the bias power source 64. In other words, a direction of a bias current Ib flowing between both ends of the conductor portion 42 is made selectable.

In the example of FIG. 11, as in the example of FIG. 4, the switch 56 is in the state of executing the first plating process in which the terminal 56a and the plating power source 54 are connected. On the other hand, in the bias circuit 63 shown in FIG. 11, the switch 66 connects a terminal 66a and a positive electrode of the bias power source 64, and the terminal 66a is connected through the conductive wire 68 to a right end portion of the conductor portion 42 serving as the plating cathode. The switch 67 connects a terminal 67a and a negative electrode of the bias power source 64, and the terminal 67a is connected through the conducting wire 69 to a left end portion of the conductor portion 42. As a result, the bias current Ib flows from the right end portion toward the left end portion of the conductor portion 42.

The magnitude of the bias current Ib is made larger than the magnitude of the plating current Ip. Since the bias current Ib does not contribute to the electrodeposition of plating, the magnitude of the plating current Ip can be minimized for performing the plating processing, and additionally, when the surface of the conductor portion 42 is plated by metal ions, the magnetization thereof is aligned by both the plating current Ip and the bias current Ib, so that the magnetic anisotropy is more easily induced. Therefore, in this embodiment, a combination of the plating current Ip and the bias current Ib corresponds to the formation current of the present invention. In this case, while a magnetic field is generated in the conductor portion 42 based on the formation current flowing through the conductor portion 42, the bias current Ib is larger than the plating current Ip in this embodiment, and therefore, it can be considered that a magnetic field Bb dependent on the bias current Ib is generated. As a result, the plating is configured such that the magnetization direction of the metal ions is aligned with the direction of the magnetic field Bb, as in the embodiment described above.

By switching the switch 66 to connect the terminal 66B and the positive electrode of the bias power source 64 and switching the switch 67 to connect the terminal 67b and the negative electrode of the bias power source 64 as indicated by broken lines in the bias circuit 63 shown in FIG. 11, the bias current Ib' can be allowed to flow from the left end portion to the right end portion of the conductor portion 42, i.e., in the direction opposite to the bias current Ib, through the conductive wires 69 and 68. When the second plating process described above is executed, the bias current Ib' is allowed to flow in this way, so that the magnetization in the second layer to be generated can be oriented oppositely to the magnetization of the first layer generated in the first plating process. Even when the bias current is inverted in direction as the bias current Ib', the magnitude of the bias current Ib' is larger than the plating current Ip, and therefore, it can be considered that a magnetic field Bb' dependent on the bias current Ib' is generated. This magnetic field Bb' has a direction opposite to the magnetic field Bb based on the bias current Ib described above.

According to this embodiment, while the magnetic moment is oriented by both the plating current Ip for generating a potential difference between the conductor portion 42 serving as the plating cathode and the plating anode 52 and the bias current Ib for aligning the magnetic moment in the soft magnetic film 44, the soft magnetic film 44 can be formed by plating.

Although not exemplarily illustrated one by one, the present invention is implemented with various other modifications applied without departing from the spirit thereof.

For example, in the embodiments described above, the magnetic sensor 10 is made up of the one probe portion 12; however, the present invention is not limited to this form and, for example, two probe portions 12 can be used for a magnetic sensor constituting a gradiometer sensor by differentiating outputs of the two probe portions 12.

In the embodiments described above, one each of the first layer 44a and the second layer 44b having the magnetization directions opposite to each other is disposed; however, the present invention is not limited to this form. Specifically, the number of layers serving as the first layer 44a and the second layer 44b is not limited as long as the layers are disposed such that an amount of magnetization is substantially equal in each direction. Similarly, the thicknesses of the first layer 44a and the second layer 44b are not limited.

In the embodiment described above, the current Ie supplied from the power supply portion 22 to the conductor portion 42 is a current changing on the basis of time, and this current Ie may be inverted on the basis of time alternately between predetermined positive and negative values having an equal absolute value, and even if the current is inverted on the basis of time between a predetermined positive value and 0, a certain effect can be obtained. Regarding the form of change, the current may be inverted, i.e., changed along a square wave shape, or may be changed along a sine wave shape.

In the embodiments described above, an example of disposing the soft magnetic film 44 by plating is described as a form of the soft magnetic film 44 formed on the surface of the conductor portion 42; however, the present invention is not limited to this form. Specifically, the magnetic anisotropy is induced even in the soft magnetic film 44 deposited by ion plating or sputtering.

In the embodiments described above, copper or nickel is used for the conductor portion 42; however, this is merely an example, and a non-metallic substance may be used as long as the substance is a conductor on which the soft magnetic film 44 can be electrodeposited by plating etc. For example, carbon etc. are usable.

REFERENCE SIGNS LIST

10: magnetic sensor device (magnetic sensor)
14; circuit portion (excitation portion, magnetic detection portion)
22: current supply portion (power supply)
42; conductor portion (plating cathode)
44: soft magnetic film (magnetic material portion)
44a: first layer
44b: second layer
50: coil (magnetic detection portion)
52: plating material (plating anode)
Be: applied magnetic field.
Ip: plating current (formation current)
Ib: bias current (formation current)

What is claimed is:
1. A magnetic sensor comprising:
a magnetic material portion;
an excitation portion applying an applied magnetic field changing on the basis of time to the magnetic material portion; and
a magnetic detection portion detecting a magnetic field generated by the magnetic material portion,
the magnetic sensor detecting a magnetic field by the magnetic detection portion detecting a detection magnetic field generated due to magnetic moments of the magnetic material portion changing between a state without application of the applied magnetic field and a state of being magnetized by the applied magnetic field, wherein:
the excitation portion is configured to include a conductive material formed into an elongated shape,
the magnetic material portion includes a soft magnetic film made up of a plurality of layers, one of which is disposed on a side surface of the conductive material in intimate contact with the side surface of the conductive material, and which are disposed in intimate contact with each other, the magnetic moments of the magnetic material portion are oriented along circumferential directions of the conductive material orthogonal to a longitudinal direction of the conductive material, the magnetic moment in each of the plurality of layers of the soft magnetic film is oriented in one direction of the circumferential directions orthogonal to the longitudinal direction of the conductive material or in a direction opposite to the one direction, the magnetic material portion includes at least each one of a first layer having the magnetic moment oriented in the one direction and a second layer having the magnetic moment oriented in the direction opposite to the one direction, and the magnetic moment orientated in the one direction and the magnetic moment oriented in the direction opposite to the one direction are distributed in substantially equal amounts.

2. The magnetic sensor according to claim 1, wherein the magnetic detection portion is a solenoid coil, wherein the solenoid coil is arranged such that the conductive material provided with the magnetic material portion is housed in a cylindrical space of the solenoid coil with a longitudinal direction of the solenoid coil made identical to the longitudinal direction of the conductive material, and wherein the magnetic detection portion performs magnetic detection based on an electromotive force generated at both ends of the solenoid coil.

3. The magnetic sensor according to claim 1, wherein the magnetic material portion has composition containing iron (Fe) and nickel (Ni).

4. The magnetic sensor according to claim 1, wherein the magnetic material portion contains iron (Fe) in a proportion of 15 to 25%.

5. The magnetic sensor according to claim 1, wherein an amount of change in impedance of the conductive material is 5% or less when an excitation current has a frequency of 100 [MHz] or less within a range of magnitude of an external magnetic field of −50 [μT] or more to 50 [μT] or less.

6. The magnetic sensor according to claim 1, wherein the first layer and the second layer are sequentially disposed.

7. The magnetic sensor according to claim 1, wherein the one of the plurality of layers is disposed on the side surface of the conductive material over an entire circumference of the conductive material.

* * * * *